United States Patent
Wang et al.

(10) Patent No.: US 12,189,413 B2
(45) Date of Patent: Jan. 7, 2025

(54) CIRCUITS AND METHODS FOR MULTI-PHASE CLOCK GENERATORS AND PHASE INTERPOLATORS

(71) Applicant: The Trustees of Columbia University in the City of New York, New York, NY (US)

(72) Inventors: Zhaowen Wang, New York, NY (US); Yudong Zhang, La Jolla, CA (US); Peter Kinget, Summit, NJ (US)

(73) Assignee: The Trustees of Columbia University in the City of New York, New York, NY (US)

(*) Notice: Subject to any disclaimer, the term of this patent is extended or adjusted under 35 U.S.C. 154(b) by 197 days.

(21) Appl. No.: 17/665,401

(22) Filed: Feb. 4, 2022

(65) Prior Publication Data

US 2022/0244755 A1     Aug. 4, 2022

Related U.S. Application Data

(60) Provisional application No. 63/145,754, filed on Feb. 4, 2021, provisional application No. 63/306,898, filed on Feb. 4, 2022.

(51) Int. Cl.
*G06F 1/06*      (2006.01)
*H03B 27/00*      (2006.01)
(Continued)

(52) U.S. Cl.
CPC .............. *G06F 1/06* (2013.01); *H03B 27/00* (2013.01); *H03K 3/0315* (2013.01); *H03K 5/133* (2013.01); *H03B 2200/0074* (2013.01)

(58) Field of Classification Search
CPC ... G06F 1/06; H03B 27/00; H03B 2200/0074; H03K 3/0315; H03K 5/133
(Continued)

(56) References Cited

U.S. PATENT DOCUMENTS 7,456,673 B2   11/2008   Bae et al.
7,636,411 B2   12/2009   Canagasaby et al.
(Continued)

OTHER PUBLICATIONS

Abidi, A.A., "Phase Noise and Jitter in CMOS Ring Oscillators", In IEEE Journal of Solid-State Circuits, vol. 41, No. 8, Aug. 2006, pp. 1803-1816.
(Continued)

*Primary Examiner* — Arnold M Kinkead
(74) *Attorney, Agent, or Firm* — Byrne Poh LLP

(57) ABSTRACT

Circuits and methods for multi-phase clock generators and phase interpolators are provided. The multi-phase clock generators include a delay line and multi-phase injection locked oscillator. At each stage of the multi-phase injection locked oscillator, injection currents are provided from a corresponding stage of the delay line. Outputs of the multi-phase injection locked oscillator and provided to mixers which produce inputs to an operational transconductance amplifier which provides feedback to the delay line and the multi-phase injection locked oscillator. The phase interpolator uses a technique of flipping certain input clock signals to reduce the number of components required while still being able to interpolate phase over 360 degrees and to reduce noise.

12 Claims, 14 Drawing Sheets

(51) Int. Cl.
*H03K 3/03* (2006.01)
*H03K 5/133* (2014.01)

(58) Field of Classification Search
USPC ..... 327/116, 129, 117, 271, 284; 331/57, 45
See application file for complete search history.

(56) References Cited

U.S. PATENT DOCUMENTS

| | | | |
|---|---|---|---|
| 7,746,971 B2 | 6/2010 | Masui et al. | |
| 8,487,682 B2 | 7/2013 | Du et al. | |
| 8,664,993 B2 | 3/2014 | Gu | |
| 8,718,217 B2 | 5/2014 | Walker et al. | |
| 8,941,420 B2* | 1/2015 | Zerbe | H03L 7/24 327/119 |
| 2020/0099507 A1 | 3/2020 | Shinmyo et al. | |

OTHER PUBLICATIONS

Adler, R., "A Study of Locking Phenomena in Oscillators", In Proceedings of IRE, vol. 34, No. 6, Jun. 1946, pp. 351-357.
Auvergne, D., et al., "Signal Transition Time Effect on CMOS Delay Evaluation", In IEEE Transactions on Circuits System 1, Fundamental Theory Applications, vol. 47, No. 9, Sep. 2000, pp. 1362-1369.
Balankutty, A., et al., "Mismatch Characterization of Ring Oscillators", In Proceedings of IEEE Custom Integrated Circuits Conference, San Jose, CA, US, Sep. 2007, pp. 515-518.
Cevrero, A., et al., "6.1 A 100Gb/s 1.1pJ/b PAM-4 RX with Dual-Mode 1-Tap PAM-4/3-Tap NRZ Speculative DFE in 14nm CMOS FinFET", In IEEE International Solid-State Circuits Conference, Feb. 17-21, 2019, pp. 112-114.
Chen, S., et al., "A 4-1o-16GHz Inverter-Based Injection-Locked Quadrature Clock Generator with Phase Interpolators for Multi-Standard I/Os in 7nm FinFET", In IEEE International Solid-State Circuits Conference, Feb. 11-15, 2018, pp. 390-392.
Chen, W.C., et al., "A 4-to-18 GHz Active Poly Phase Filter Quadrature Clock Generator wtih Phase Error Correction in 5 nm CMOS", In Proceedings of IEE Symposium VLSI Circuits, Honolulu, HI, US, Jun. 2020, pp. 1-2.
Dunwell, D. and Carusone, A.C., "Modeling Oscillator Injection Locking using the Phase Domain Response", In IEEE Transactions Circuits System 1 Reg. Papers, vol. 60, No. 11, Nov. 2013, pp. 2823-2833.
Elshazly, A., et al., "A 2 GHZ-to7.5 GHz Quadrature Clock-Generator using Digital Delay Locked Loops for Multi-Standard I/Os in 14 nm CMOS", In Proceedings of the Symposium on VLSI Circuits, Honolulu, HI, US, Jun. 2014, pp. 1-2.
Errett, M., et al., "A 126 mW 56 GB/s NRZ Wireline Transceiver for Synchronous Short-Reach Applications in 16 nm FinFET", In IEEE International Solid-State Circuits Conference Digest Technical Papers, Feb. 2018, pp. 274-276.
Gangasani, G.R., et al., "A 16-Gb/s Backplane Transceiver with 12-Tap Current Integrating DFE and Dynamic Adaption of Voltage Offset and Timing Drifts in 45-nm SOI CMOS Technology", In Proceedings of IEEE Custom Integrated Circuits Conference, San Jose, CA, US, Sep. 2011, pp. 1-4.
Gao, X., et al., "Jitter Analysis and a Benchmarking Figure-of-Merit for Phase-Locked Loops", In IEEE Transactions on Circuits Systems II, Exp. Briefs, vol. 56, No. 2, Feb. 2009, pp. 117-121.
Homayoun, A. and Razavi, B., "Relation between Delay Line Phase Noise and Ring Oscillator Phase Noise", In IEEE Journal of Solid-State Circuits, vol. 49, No. 2, Feb. 2014, pp. 384-391.
Hossain, M., and Carusone, A.C., "CMOS Oscillators for Clock Distribution and Injection-Locked Deskew", In IEEE Journal of Solid-State Circuits, vol. 44, No. 8, Aug. 2009, pp. 2138-2153.
Im, J., et al., "A 112-Gb/s PAM-4 Long-Reach Wireline Transceiver using a 36-Way Time-Interleaved SAR ADC and Inverter-Based RX Analog Front-End in 7-nm FinFET", In IEEE Journal of Solid-State Circuits, vol. 56, No. 1, Jan. 2021, pp. 7-18.
Jeon, M., et al., "A 6-Gbps Dual-Mode Digital Clock and Data Recovery Circuit in a 65-nm CMOS Technology", In Analog Integrated Circuits Signal Process, vol. 85, Jul. 2015, pp. 209-215.
Kabbani, A., et al., "Technology-Portable Analytical Model for DSM CMOS Inverter Transition-Time Estimation", In IEEE Transactions on Computer Aided Design Integration, vol. 22, No. 9, Sep. 2003, pp. 1177-1187.
Kawamoto, T., et al., "3.2 Mutli-Standard 185 fsrms 0.3-to-28 GB/s 40 dB Backplane Signal Conditioner with Adaptive Pattern-Match 36-Tap DFE and Data-Rate-Adjustment PLL in 28 nm CMOS", In IEEE Internation Solid-State Circuits Conference Digest Technical Papers, San Francisco, CA, US, Feb. 2015, pp. 1-3.
Kinget, P., et al., "An Injection-Locking Scheme For Precision Quadrature Generation", In IEEE Journal of Solid-State Circuits, vol. 37, No. 7, Jul. 2002, pp. 845-851.
Kwon, D., et al., "A Clock and Data Recovery Circuit with Programmable Multi-Level Phase Detector Characteristics and a Built-In Jitter Monitor", In IEEE Transactions on Circuits System 1, vol. 62, No. 6, Jun. 2015, pp. 1472-1480.
Mazzanti, A., et al., "A Low-Phase Noise Multi-Phase LO Generator for Wideband Demodulators Based on Reconfigurable Sub-Harmonic Mixers", In IEEE Journal of Solid-State Circuits, vol. 45, No. 10, Oct. 2010, pp. 2104-2115.
Mirzaei, A., et al., "Multi-Phase Injection Widens Lock Range of Ring-Oscillator-Based Frequency Dividers", In IEEE Journal of Solid-State Circuits, vol. 43, No. 3, Feb. 25, 2008, pp. 656-671.
Monaco, E., et al., "A 2-11GHz 7-Bit-High-Linearity Phase Rotator Based on Wideband Injection-Locking Multi-Phase Generation for High-Speed Serial Links in 28-nm CMOS FDSOI", In IEEE Journal of Solid-State Circuits, vol. 52, No. 7, Jun. 8, 2017, pp. 1739-1752.
Navid, R., et al., "A 40Gb/s Serial Link Transceiver in 28 nm CMOS Technology", In IEEE Journal of Solid-State Circuits, vol. 50, No. 4, Apr. 2015, pp. 814-827.
Raj, M., et al., "22.3 A 4-to-11GHz Injection-Locked Quarter-Rate Clocking for an Adaptive 153fJ/b Optical Receiver in 28nm FDSOI CMOS", In IEEE International Solid-State Circuits Conference, Feb. 22-15, 2015, pp. 404-405.
Razavi, B., "A Study of Phase Noise in CMOS Oscillators", IEEE Journal of Solid-State Circuits, vol. 31, No. 3, Mar. 1996, pp. 331-343.
Rodoni, L, et al., "A 5.75 to 44 GB/s Quarter Rate CDR with Data Rate Selection in 90nm Bulk CMOS" In IEEE Journal of Solid-State Circuits, vol. 44, No. 7, Jul. 2009, pp. 1927-1941.
Shi, Y., et al., "A Design of Multi-Phase Clocks Generator for CDR", In Proceedings of the 2016 3rd International Conference on Materials Engineering, Manufacturing Technology and Control, Apr. 2016, pp. 1664-1669.
Toifl, T., et al., "A 0.94-ps-RMS-jitter 0.016-mm2 2.5-GHz Multiphase Generator PLL with 360 degree Digitally Programmable Phase Shift for 10-Gb/s Serial Links", In IEEE Journal of Solid-State Circuits, vol. 40, No. 12, Dec. 2005, pp. 2700-2712.
Wang, Z., et al., "A High-Accuracy Multi-Phase Injection-Locked 8-Phase 7 GHz Clock Generator in 65 nm with 7 b Phase Interpolators for High-Speed Data Links", In IEEE International Solid-State Circuits Conference Digest Technical Papers, San Francisco, CA, US, Feb. 2021, pp. 186-188.
Won, H., et al., "A 0.87 W Transceiver IC for 100 Gigabit Ethernet in 40 nm CMOS" In IEEE Journal of Solid-State Circuits, vol. 50, No. 2, Feb. 2015, pp. 399-413.
Zhang, B., et al., "A 28 GB/s Multi-Trandard Serial-Link Transceiver for Backplane Applications in 28 nm CMOS", In IEEE International Solid-State Circuits Conference Digest Technical Papers, Feb. 2015, pp. 1-3.
Zhang, Z., et al., "A 32-Gb/s 0.46-pJ/bit PAM4 CDR Using a Quarter-Rate Linear Phase Detector and a Self-Biased PLL-Based Multiphase Clock Generator", In IEEE Journal of Solid State Circuits, vol. 55, No. 10, Jul. 2020, pp. 2734-2746.

* cited by examiner

| Interpolation Range | Diff Pairs Active In | Flipping 0°/180° | Flipping 45°/225° | Flipping 90°/270° | Flipping 135°/315° |
|---|---|---|---|---|---|
| 0° -> 45° | Slice1 | 0 | 0 | 0 | 1 |
| 45° -> 90° | Slice2 | 0 | 0 | 0 | 0 |
| 90° -> 135° | Slice3 | 1 | 0 | 0 | 0 |
| 135° -> 180° | Slice4 | 1 | 1 | 0 | 0 |
| 180° -> 225° | Slice1 | 1 | 1 | 1 | 0 |
| 225° -> 270° | Slice2 | 0 | 1 | 1 | 1 |
| 270° -> 315° | Slice3 | 0 | 0 | 1 | 1 |
| 315° -> 360° | Slice4 | 0 | 1 | 1 | 1 |

Key:
1 – clock flipped
0 – clock not flipped

FIG. 9

CIRCUITS AND METHODS FOR MULTI-PHASE CLOCK GENERATORS AND PHASE INTERPOLATORS

CROSS-REFERENCE TO RELATED APPLICATION

This application claims the benefit of U.S. Provisional Patent Application No. 63/145,754, filed Feb. 4, 2021, and of U.S. Provisional Patent Application No. 63/306,898, filed Feb. 4, 2022, each of which is hereby incorporated by reference herein in its entirety.

STATEMENT REGARDING GOVERNMENT FUNDED RESEARCH

This invention was made with government support under contract DE-AR0000843 awarded by the Department of Energy ARPA-E Enlitened program. The government has certain rights in the invention.

BACKGROUND

An insatiable demand for high-capacity and high-speed I/Os is pushing wireline transceivers to a higher aggregate data rate. Multi-phase sampling is adopted in receivers to achieve the same data rate with a lower clock frequency, thus relaxing the analog-to-digital (ADC) speed requirement. Multi-phase sampling clocks can be directly generated by multi-phase clock generators (MPCGs) from de-skewed clock sources or can be generated by one or more phase interpolators (PIs).

The reduced symbol period of a higher data rate puts more stringent requirements on jitter and phase accuracy of multi-phase clocks and the linearity of PIs.

Accordingly, new circuits and methods for MPCGs and PIs are desirable.

SUMMARY

In accordance with some embodiments, circuits and methods multi-phase clock generators and phase interpolators are provided. In some embodiments, circuits for a multi-phase clock generator are provided, the circuits comprising: a delay line comprising a first plurality of differential unit delay cells, wherein each of the first plurality of differential unit delay cells has a pair of clock inputs and a pair clock outputs, wherein the first plurality of differential unit delay cells are connected in series such that the pair of clock outputs of a first of the first plurality of differential unit delay cells is connected to the pair of clock inputs of a second of the first plurality of differential unit delay cells, and wherein each unit cell of the first plurality of differential unit delay cells outputs a pair of clock signals having different phases than each pair of clock signals output by other of the first plurality of differential unit delay cells; and a ring oscillator comprising a second plurality of differential unit delay cells, wherein each of the second plurality of differential unit delay cells has a pair of clock inputs, a pair of current injection inputs, and a pair clock outputs, wherein the pair of current injection inputs of each of the second plurality of differential unit delay cells is coupled to the pair of clock outputs of a corresponding one of the first plurality of differential unit delay cells, wherein the second plurality of differential unit delay cells are connected in series such that the pair of clock outputs of a first of the second plurality of differential unit delay cells is connected to the pair of inputs of a second of the second plurality of differential unit delay cells, wherein the pair of outputs of a last of the second plurality of differential unit delay cells are flipped and connected to the pair of inputs of a first of the second plurality of differential unit delay cells, and wherein each unit cell of the second plurality of differential unit cells outputs a pair of clock signals having different phases than each pair of clock signals output by other of the second plurality of differential unit delay cells.

In some of these embodiments, the delay line further comprises a dummy unit cell connected to a last of the first plurality of differential unit delay cells.

In some of these embodiments, the pair of current injection inputs of each of the second plurality of differential unit delay cells is coupled to the pair of output of a corresponding one of the first plurality of differential unit delay cells by a buffer.

In some of these embodiments, each unit cell in the first plurality of differential unit delay cells comprises: a first inverter having an input connected to a first of the pair of clock inputs of the unit cell and having an output connected to a first of the pair of clock outputs of the unit cell; a second inverter having an input connected to a second of the pair of clock inputs of the unit cell and having an output connected to a second of the pair of clock outputs of the unit cell; a third inverter having an input connected to the output of the first inverter and having an output connected to the output of the second inverter; and a fourth inverter having an input connected to the output of the second inverter and having an output connected to the output of the first inverter.

In some of these embodiments, each of the first plurality of differential unit cells also has a pair of current injection inputs.

In some of these embodiments, the pair of current injection inputs for each of the first plurality of differential unit delay cells is connected to ground.

In some of these embodiments, each unit cell in the first plurality of differential unit delay cells comprises: a first inverter having an input connected to a first of the pair of clock inputs of the unit cell and having an output connected to a first of the pair of clock outputs of the unit cell; a second inverter having an input connected to a second of the pair of clock inputs of the unit cell and having an output connected to a second of the pair of clock outputs of the unit cell; a third inverter having an input connected to the output of the first inverter and having an output connected to the output of the second inverter; a fourth inverter having an input connected to the output of the second inverter and having an output connected to the output of the first inverter; and a first buffer having an input connected to a first of the pair of current injection inputs of the unit cell and having an output connected to the first of the pair of clock outputs of the unit cell; and a second buffer having an input connected to a second of the pair of current injection inputs of the unit cell and having an output connected to the second of the pair of clock outputs of the unit cell.

In some of these embodiments, the first buffer is formed from a plurality of selectable, parallel transistors.

In some of these embodiments, each unit cell in the second plurality of differential unit delay cells comprises: a first inverter having an input connected to a first of the pair of clock inputs of the unit cell and having an output connected to a first of the pair of clock outputs of the unit cell; a second inverter having an input connected to a second of the pair of clock inputs of the unit cell and having an output connected to a second of the pair of clock outputs of the unit cell; a third inverter having an input connected to the output of the first inverter and having an output connected to the output of the second inverter; a fourth inverter having an input connected to the output of the second inverter and having an output connected to the output of the first inverter; and a first buffer having an input connected to a first of the pair of current injection inputs of the unit cell and having an output connected to the first of the pair of clock outputs of the unit cell; and a second buffer having an input connected to a second of the pair of current injection inputs of the unit cell and having an output connected to the second of the pair of clock outputs of the unit cell.

In some of these embodiments, each unit cell of the first plurality of differential unit delay cells has includes an identical set of components interconnected in an identical manner.

In some of these embodiments, each unit cell of the second plurality of differential unit delay cells includes an identical set of components interconnected in an identical manner.

In some of these embodiments, at least one unit cell of the first plurality of differential unit delay cells and at least one unit cell of the second plurality of differential unit delay cells include an identical set of components interconnected in an identical manner.

In some of these embodiments, the circuit further comprises a first mixer that mixes the pairs of outputs of two of the second plurality of differential unit delay cells to produce a first mixer output signal and a second mixer that mixes the pairs of outputs of another two of the second plurality of differential unit delay cells to produce a second mixer output signal.

In some of these embodiments, the circuit further comprises an operation transconductance amplifier that receives the first mixer output signal and the second mixer output signal and produce tuning feedback signal that is provided to the delay line and to the ring oscillator.

BRIEF DESCRIPTION OF THE DRAWINGS

FIG. 9 is an example of a table showing clock flipping technique in accordance with some embodiments.

DETAILED DESCRIPTION

In accordance with some embodiments, new circuits and methods multi-phase clock generators and phase interpolators are provided.

Figure 1:
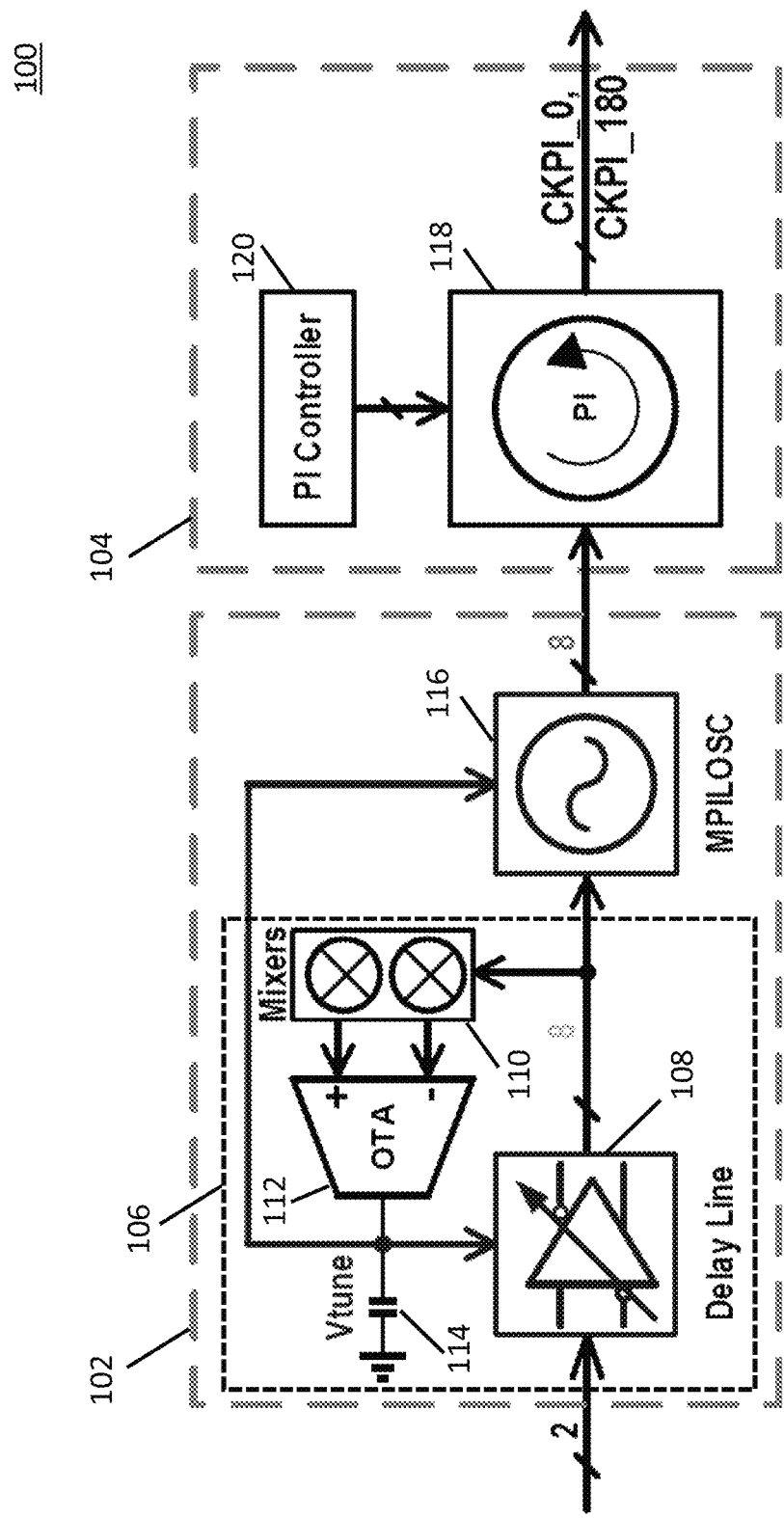
FIG. 1 is an example of combined multi-phase clock generator and phase interpolator in accordance with some embodiments.

Turning to FIG. 1, an example block diagram of a multi-phase clock generator (MPCG) and phase interpolator (PI) circuit 100 in accordance with some embodiments is shown. As illustrated, circuit 100 includes a MPCG 102 and a PI 104.

MPCG 102 can be any suitable multi-phase clock generator in some embodiments. For example, as shown in FIG. 1, MPCG 102 can include a quadrature delay line loop (QDLL) 106 and a multi-phase injection locked oscillator (MPILOSC) 116 in some embodiments.

Any suitable QDLL can be used as QDLL 106 in some embodiments. For example, as shown in FIG. 1, QDLL 106 can include a delay line 108, passive mixers 110, operational transconductance amplifier (OTA) 112, and capacitor 114.

PI 104 can be any suitable phase interpolator in some embodiments. For example, as shown in FIG. 1, PI 104 can include a PI core 118 and a PI controller 120 in some embodiments.

In some embodiments, by tuning the delay of the stages in delay line 108, the $f_0$ of MPILOSC 116 can be tuned. A control voltage $V_{tune}$ of QDLL 106 biases both the stages in delay line 108 to have a unit delay of $1/(2N\ f_{inj})$ and the stages in the MPILOSC to have $f_0 = f_{inj}$, in some embodiments. In some embodiments, the delay line outputs have a high spectral purity and suppress the MPILOSC phase noise over a wide injection bandwidth. Moreover, the phase errors due to the finite QDLL loop gain, finite matching of the loading within the delay line, and layout asymmetry are corrected by the MPILOSC, in some embodiments. The two-step multi-phase clock generation scheme thus combines the advantages of low-noise delay lines and symmetric ROSCs and breaks the tradeoff between jitter and phase accuracy in two-phase IL-ROSCs in some embodiments.

Figure 2A:
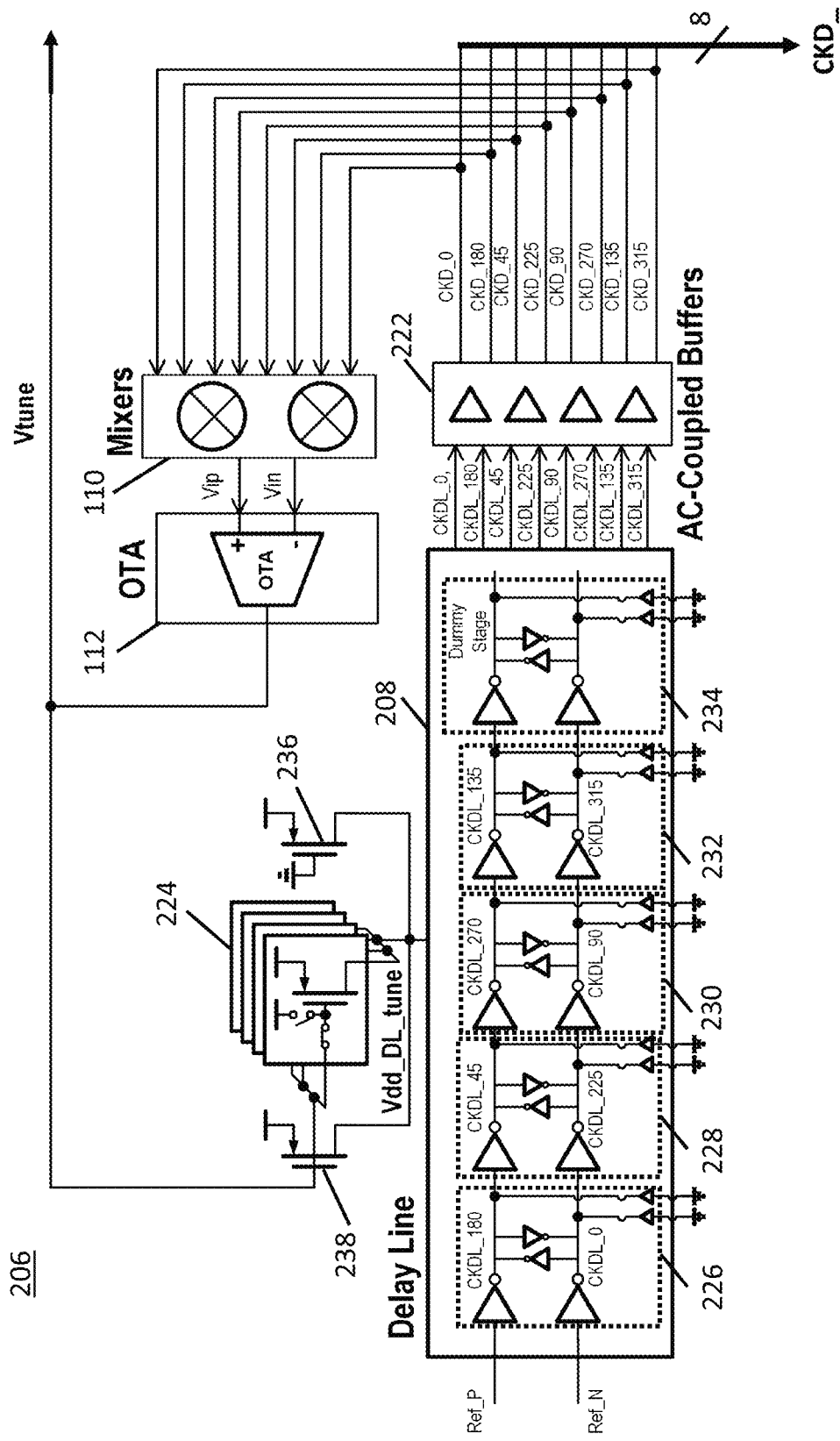
FIG. 2A is an example of multi-phase clock generator in accordance with some embodiments.

Turning to FIG. 2A, further details of a QDLL 206 that can be used as QDLL 106 in accordance with some embodiments is shown.

As illustrated, QDLL 206 includes a delay line 208 that receives a differential reference clock (Ref_P and Ref_N) and a Vdd_DL_tune signal, and that outputs eight clock signals (CKDL_0, CKDL_180, CKDL_45, CKDL_225, CKDL_90, CKDL_270, CKDL_135, CKDL_315). Although delay line 208 outputs eight clock signals, delay line 208 can output any suitable number (such as four, for example) of clock signals in some embodiments.

As also illustrated in FIG. 2A, delay line 208 includes four unit delay cells 226, 228, 230, and 232 and a dummy stage 234. Unit delay cell 226 generates CKDL_0 and CKDL_180, unit delay cell 228 generates CKDL_45 and CKDL_225, unit delay cell 230 generates CKDL_90 and CKDL_270, and unit delay cell 232 generates CKDL_135 and CKDL_315. Although delay line 208 includes four unit delay cells, delay line 208 can include any suitable number (such as two, for example) of unit delay cells in some embodiments.

Dummy stage 234 provides loading to cell 232 that is uniform with the loading provided to cells 226, 228, and 230 by cells 228, 230, and 232, respectively.

Unit delay cells 226, 228, 230, 232, and 234 can be any suitable unit delay cells in some embodiments. For example, in some embodiments, unit delay cells 226, 228, 230, 232, and 234 can be implemented as described below in connection with FIGS. 3A and 3B.

Figure 3A:
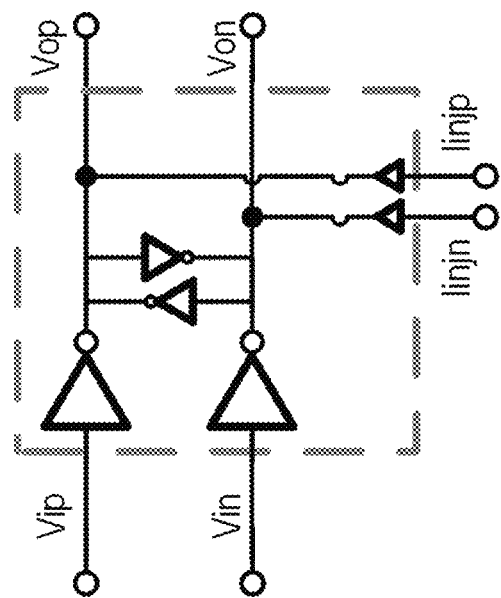
FIG. 3A is an example of pinouts of a unit delay cell in accordance with some embodiments.

FIG. 3A illustrates pin definitions of a unit delay cells in accordance with some embodiments. For example, the differential input to each unit delay cell is identified by Vip and Vin, the differential output from each unit delay cell is identified by Vop and Von, and the differential injection current to the unit delay cell is identified by Iinjp and Iinjn.

Figure 3B:
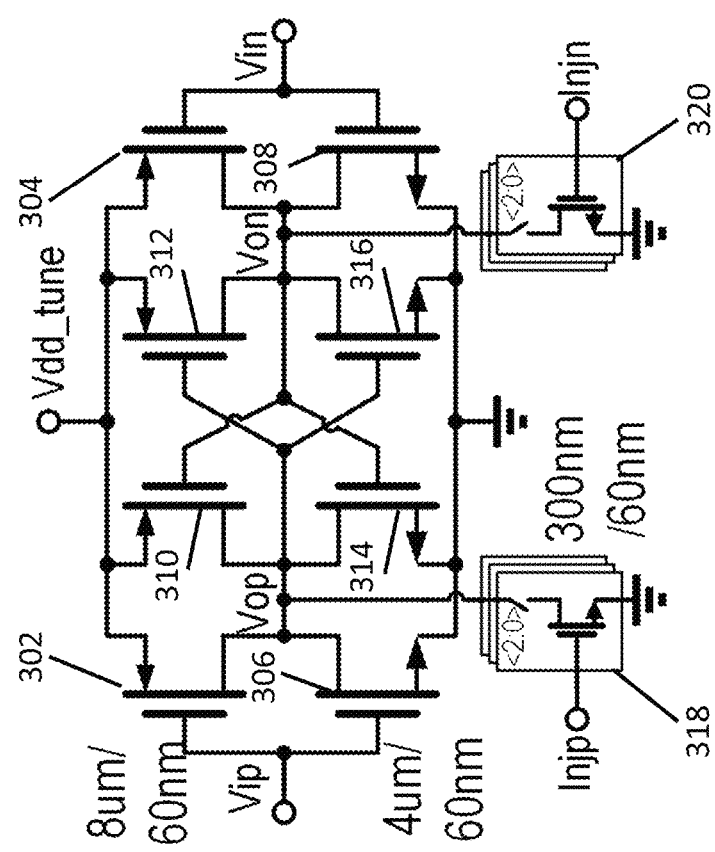
FIG. 3B is an example of a schematic of a unit delay cell in accordance with some embodiments.

FIG. 3B illustrates an example schematic of a unit delay cell in accordance with some embodiments. Any suitable transistors can be used as the transistors shown in FIG. 3B, in some embodiments. For example, these transistors can be MOSFETs, in some embodiments. More particularly, for example, transistors 302 and 304 can be p-MOSFETs having a width of 8 µm and a length of 60 nm, transistors 310 and 312 can be p-MOSFETs that are a quarter of the size of transistors 302 and 304, transistors 306 and 308 can be n-MOSFETs having a width of 4 µm and a length of 60 nm, transistors 314 and 316 can be n-MOSFETs that are a quarter of the size of transistors 306 and 308, and the transistors in 318 and 320 can be n-MOSFETs having a width of 300 nm and a length of 60 nm, in some embodiments. The sizing ratio between the transistors in 318 and 320 and the transistors 306, 308, 302, and 304 determines the injection strength in some embodiments. In some embodiments, multiple, selectable parallel transistors can be implemented for transistors 318 and 320. In this way, the injection strength can be controlled by controlling how many transistors in each of transistors 318 and 320 are active. For example, the injection strength for the unit delay cell shown in FIG. 3B with only one transistor in each of transistors 318 and 320 active is 0.3 µm/(4 µm+8 µm/2), that is, 0.04. A total injection strength of 0.12 provides a simulated locking range of ±1 GHz and phase-error sensitivity of less than 0.05 in some embodiments.

The per-stage gain $K_{DL}$ of each unit delay cell can be linearized and expressed in terms of the N-stage MPI-LOSC's gain $K_{VCO}$ as follows:

$$K_{DL} = \frac{2\pi K_{VCO}}{2Nf_0}.$$

In some embodiments, the $K_{VCO}$ can vary from 2 to 6 GHz/V across the tuning range. In some embodiments, a waveform-shaping buffer at the delay-line input reduces the amplitude of the rail-to-rail input clock to be close to the delay-line internal voltage amplitude.

As further illustrated in FIG. 2A, QDLL 206 can also include buffers 222, in some embodiments. Any suitable buffers can be used in some embodiments. For example, in some embodiments, buffers 222 can be AC-coupled buffers. Any suitable number of buffers can be included in buffers 222, in some embodiments. The outputs of buffers 222 (CKD_0, CKD_180, CKD_45, CKD_225, CKD_90, CKD_270, CKD_135, CKD_315) can be provided to the inputs of mixers 110, in some embodiments.

Figure 4:
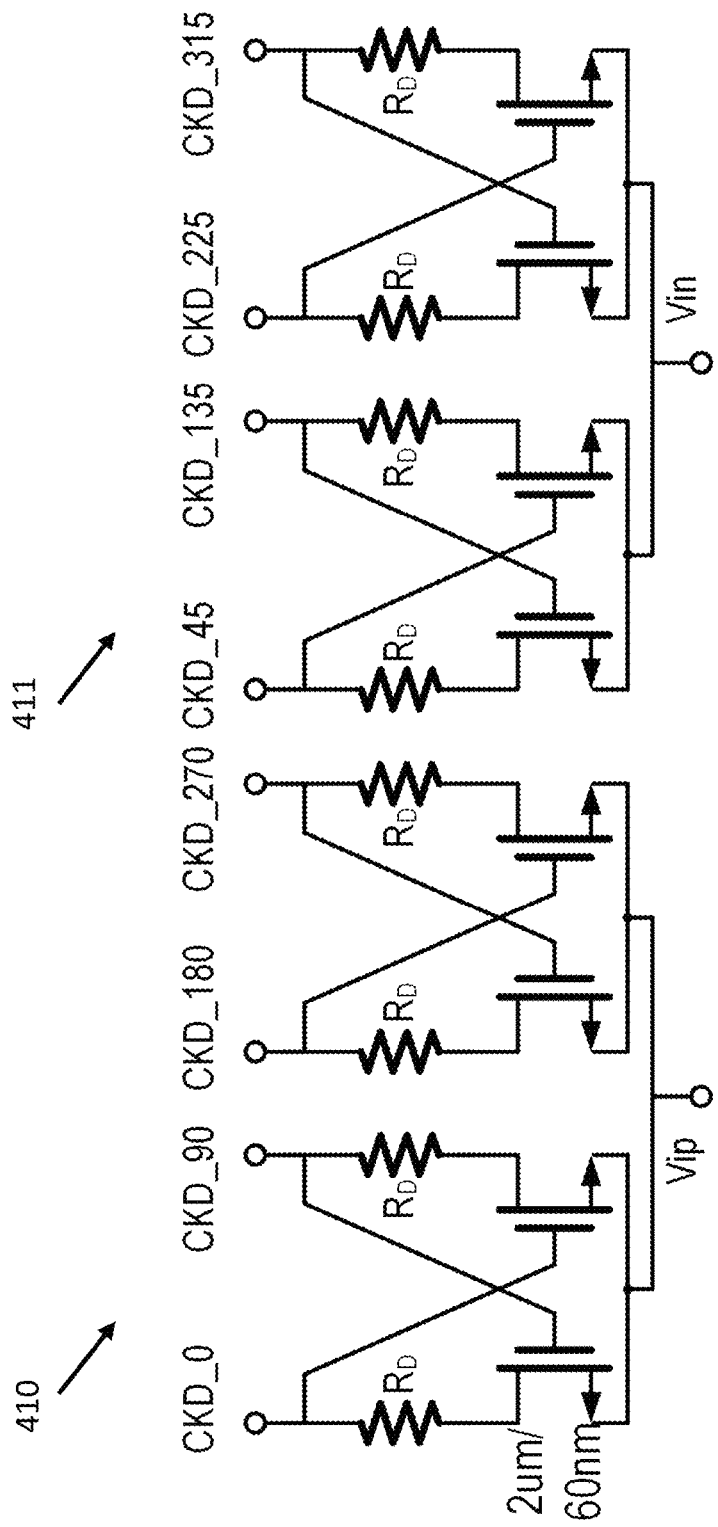
FIG. 4 is an example of a schematic of mixers in accordance with some embodiments.

Passive mixers 110 in FIG. 2A can be any suitable mixers in some embodiments. For example, passive mixers 110 can be implemented using passive mixers 410 and 411 as shown in FIG. 4, in some embodiments. Any suitable transistors can be used as the transistors shown in FIG. 4. For example, these transistors can be MOSFETs in some embodiments. More particularly, for example, the transistors can be n-MOSFETs having a width of 2 µm and a length of 60 nm, in some embodiments. Resistors RD in FIG. 4 can be any suitable resistors in some embodiments. For example, in some embodiments, resistors RD can be 1.5 kΩ resistors.

Figure 5:
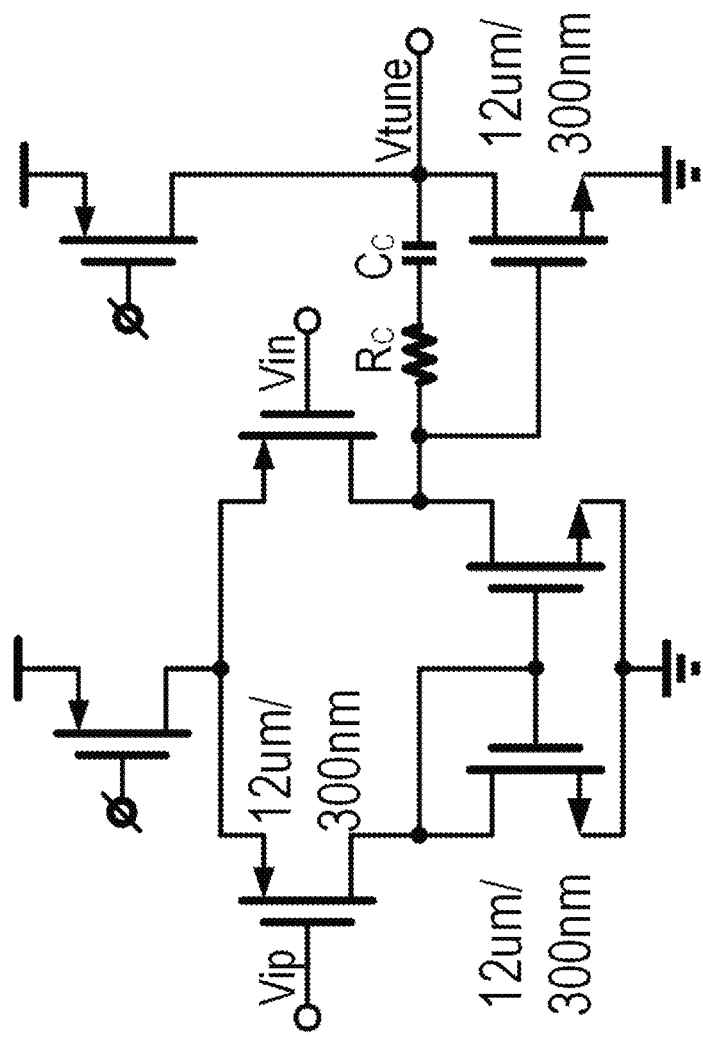
FIG. 5 is an example of an operational transconductance amplifier in accordance with some embodiments.

OTA 112 in FIG. 2A can be any suitable OTA in some embodiments. For example, OTA 112 can be implemented as shown in the schematic of FIG. 5 in some embodiments. Any suitable transistors can be used as the transistors shown in FIG. 5, in some embodiments. For example, these transistors can be MOSFETs, in some embodiments. More particularly, for example, the transistor in the top left can be p-MOSFETs having a width of 24 µm and a length of 300 nm, the transistor in the top right can be p-MOSFETs having a width of 12 µm and a length of 300 nm, the transistors in the middle row can be p-MOSFETs having a width of 12 µm and a length of 300 nm, and the transistors in the bottom row can be n-MOSFETs having a width of 12 µm and a length of 300 nm, in some embodiments. Resistor $R_C$ in FIG. 5 can be any suitable resistor in some embodiments. For example, in some embodiments, resistors $R_C$ can be a 1.2 kΩ resistor. Capacitor $C_C$ in FIG. 5 can be any suitable capacitor in some embodiments. For example, in some embodiments, capacitor can be a 2.5 pF capacitor.

The control voltage Vtune of the QDLL controls the delay of the delay stages in delay line 208.

As shown in FIG. 2A, in some embodiments, DQLL 206 also includes an array (including transistors 224 and 238) of five (or any other suitable number) pMOS transistors that control the supply voltage of unit delay cells 226, 228, 230, 232, and 234. The gates of these pMOS transistors are connected to the QDLL control voltage Vtune, or connected to the supply, depending a digital control code received by array 224. In some embodiments, an always-on pMOS transistor 236 is placed in shunt with array 252 to linearize the gain of delay line 208. The supply tuning does not add any parasitic capacitance to the oscillation nodes and achieves a higher self-oscillation frequency $f_0$ compared to load tuning or current tuning, in some embodiments. As shown, a transistor 230 is also provided to buffer Vdd_DL_tune from Vtune.

Figure 2B:
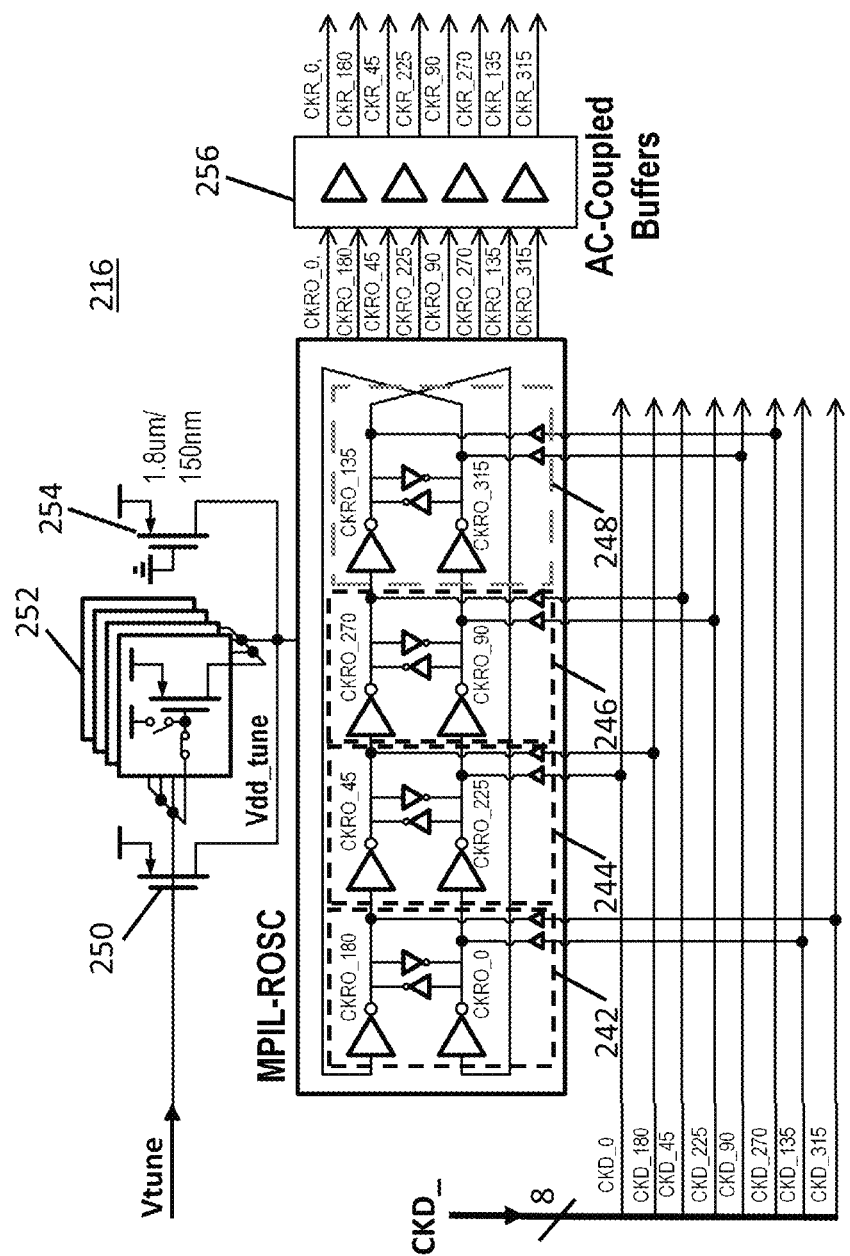
FIG. 2B is an example of phase interpolator in accordance with some embodiments.

Turning to FIG. 2B, further details of a MPILOSC 216 that can used as MPILOSC 116 in accordance with some embodiments is shown.

As illustrated, MPILOSC 216 receives eight clock signals (CKDL_0, CKDL_180, CKDL_45, CKDL_225, CKDL_90, CKDL_270, CKDL_135, CKDL_315) and a Vtune signal from QDLL 206, and outputs eight clock signals (CKRO_0, CKRO_180, CKRO_45, CKRO_225, CKRO_90, CKRO_270, CKRO_135, CKRO_315). Although MPILOSC 216 receives and outputs eight clock signals, MPILOSC 216 can receive and output any suitable number (such as four, for example) of clock signals in some embodiments.

As also illustrated in FIG. 2B, MPILOSC 216 includes four unit delay cells 242, 244, 246, and 248. Unit delay cell 242 generates CKRO_0 and CKRO_180, unit delay cell 244 generates CKRO_45 and CKRO_225, unit delay cell 246 generates CKRO_90 and CKRO_270, and unit delay cell 248 generates CKRO_135 and CKRO_315. Although MPILOSC 216 includes four unit delay cells, MPILOSC 216 can include any suitable number (such as two, for example) of unit delay cells in some embodiments.

Unit delay cells 242, 244, 246, and 248 can be any suitable unit delay cells in some embodiments. For example, unit delay cells 242, 244, 246, and 248 can be the same as unit delay cells 226, 228, 230, 232, and 234, in some embodiments. In some embodiments, unit delay cells 226, 228, 230, 232, and 234 can be implemented as described above in connection with FIGS. 3A and 3B As further illustrated in FIG. 2A, MPILOSC 216 can also include buffers 256, in some embodiments. Any suitable buffers can be used in some embodiments. For example, in some embodiments, buffers 256 can be AC-coupled buffers. Any suitable number of buffers can be included in buffers 256, in some embodiments. The outputs of buffers 256 (CKR_0, CKR_180, CKR_45, CKR_225, CKR_90, CKR_270, CKR_135, CKR_315) can be provided to device, such as phase interpolator 118 of FIG. 1, in some embodiments.

The control voltage Vtune of the QDLL controls the delay of the delay stages in the MPILOSC 216.

As shown in FIG. 2B, in some embodiments, MPILOSC 216 also includes an array (including transistors 252 and 250) of five (or any other suitable number) pMOS transistors that control the supply voltage of unit delay cells 242, 244, 246, and 248. The gates of these pMOS transistors are connected to the QDLL control voltage Vtune, or connected to the supply, depending a digital control code received by array 252. In some embodiments, an always-on pMOS transistor 254 is placed in shunt with array 252 to linearize the gain of MPILOSC 216. The supply tuning does not add any parasitic capacitance to the oscillation nodes and achieves a higher self-oscillation frequency $f_0$ compared to load tuning or current tuning, in some embodiments. As shown, a transistor 250 is also provided to buffer Vdd_tune from Vtune.

Figure 6:
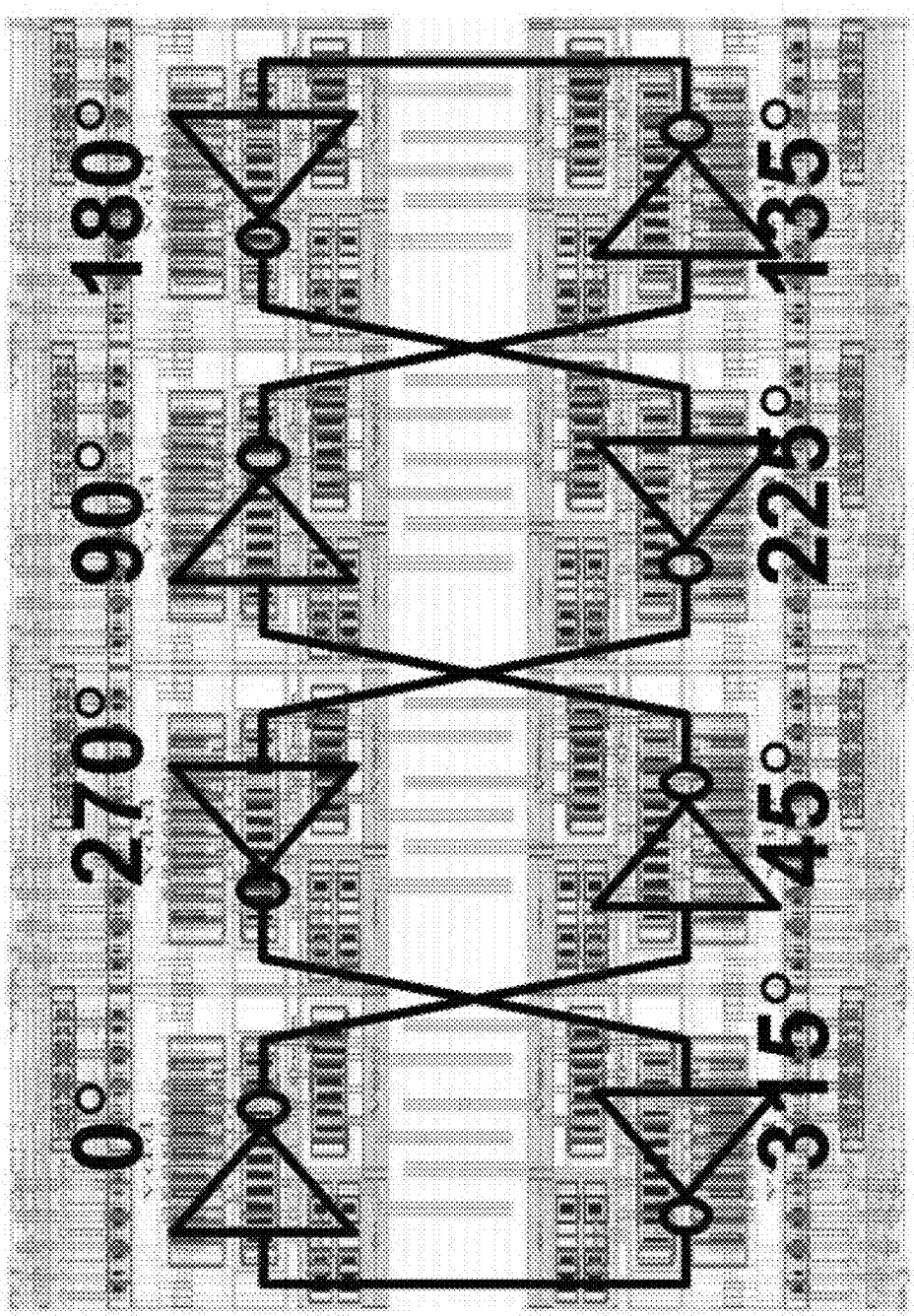
FIG. 6 is an example of layout in accordance with some embodiments.

In some embodiments, when implemented on-chip, MPI-LOSC 216 can be laid out in a bowtie pattern, as illustrated for example in FIG. 6, in order to minimize the layout-induced mismatch.

Figure 7:
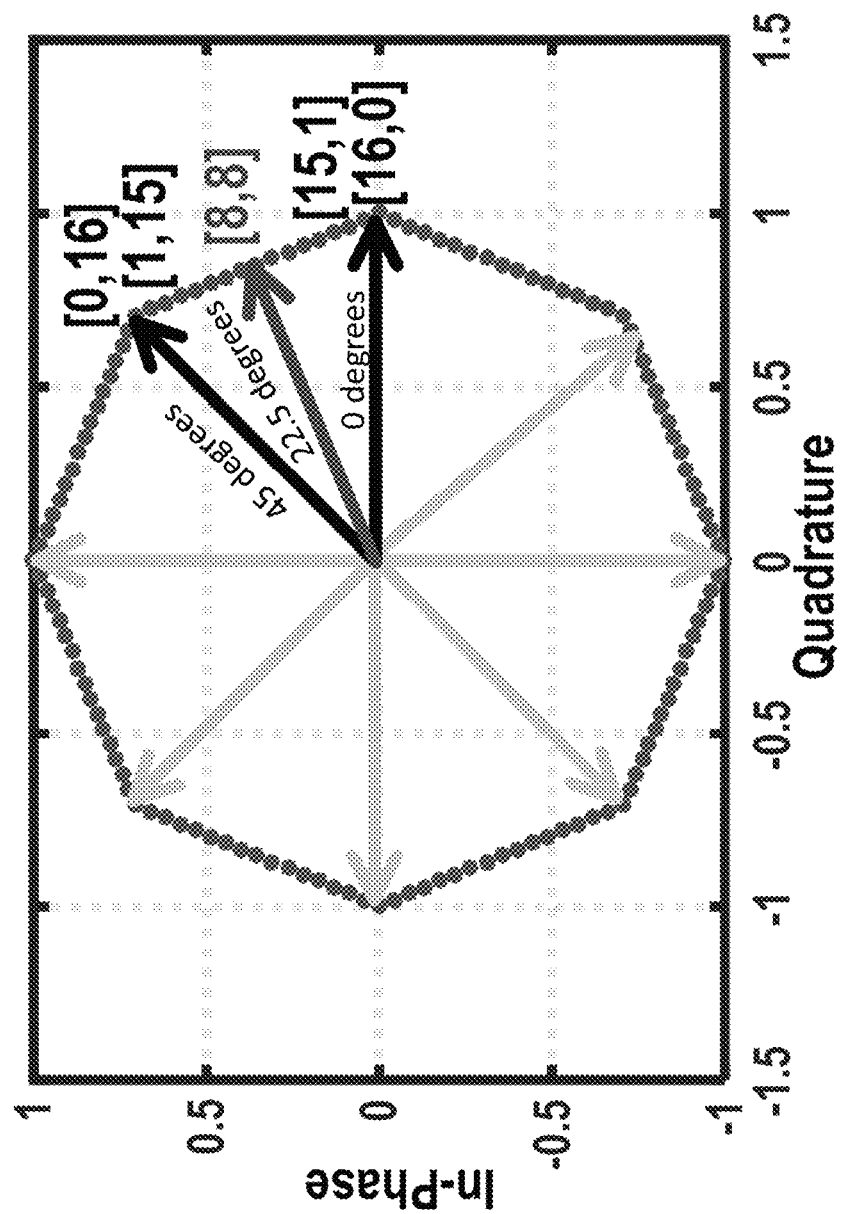
FIG. 7 is an example of a constellation showing phase interpolation in accordance with some embodiments.

Referring back to FIG. 1, as shown, circuit 100 includes a phase interpolator (PI) 104. PI 104 can be any suitable phase interpolator in some embodiments. For example, PI 104 can be an eight-phase, seven-bit phase interpolator. PI 104 can interpolate phases by providing a weighted combination of phases as shown in FIG. 7. For example, as illustrated, PI 104 can provide a 22.5 degree clock by equally weighting (e.g., [8,8]) a 0 degree clock and a 45 degree clock.

Figure 8:
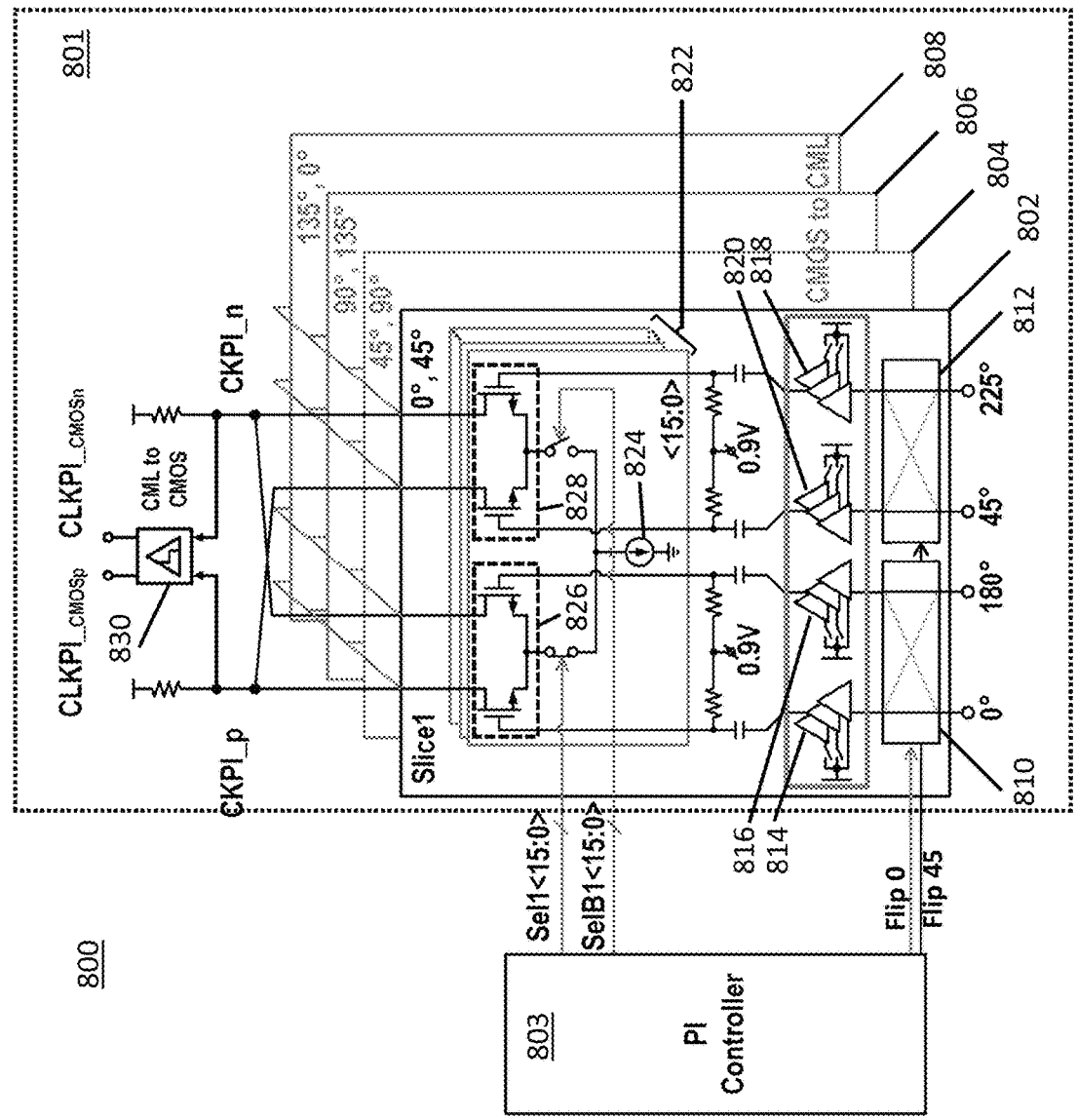
FIG. 8 is an example of a schematic of a phase interpolator in accordance with some embodiments.

Turning to FIG. 8, an example schematic of a current-mode-logic (CIVIL) implementation of a phase interpolator (PI) 800 that can be used to implement PI 104 in accordance with some embodiments is shown. As illustrated, PI 800 includes a PI core 801 (that can be used to implement PI core 118) and a PI controller 803 (that can be used to implement PI controller 120), in some embodiments.

As shown in FIG. 8, PI core 801 includes four slices (i.e., slice 1 802, slice 2 804, slice 3 806, and slice 4 808) and CIVIL-to-CMOS buffers 830. Each of slices 802, 804, 806, and 808 includes flipping buffers 810 and 812, CMOS-to-CML buffers 814, 816, 818, and 820, and dual differential pair layers 822. In some embodiments, there are 16 dual differential pair layers 822 in each slice (although any suitable number can be used in some embodiments) and each layer 822 includes a current source 824 (which can be 150 µA or any other suitable value in some embodiments), and differential pairs 826 and 828 (which can each be biased at 0.9 V or any other suitable value in some embodiments). Any suitable transistors can be used in differential pairs 826 and 828. For example, these transistors can be MOSFETs. More particularly, for example, these transistors can each be an n-MOSFET having a width of 240 nm and a length of 60 nm. The sources of the transistors in each differential pair 826 and 828 in each layer are connected to ground by a switch (which can me any suitable device, such as an n-MOSFET having any suitable size) for that pair and layer.

In some embodiments, PI core 801 receives eight (or any other suitable number) quadrature clock signals (CKRO_0, CKRO_180, CKRO_45, CKRO_225, CKRO_90, CKRO_270, CKRO_135, CKRO_315) from MPILOSC 116 (which can be implemented using MPILOSC 216 in some embodiments), receives eight 16-bit (or any other suitable number of bits) thermometer encoded digital control words (one word for each set of layers for each differential pair 826/828 in each slice (i.e.:
  1. one 16-bit word for differential pair 826 in slice 1 802 wherein each bit corresponds to one of the layers for that differential pair;
  2. one 16-bit word for differential pair 828 in slice 1 802 wherein each bit corresponds to one of the layers for that differential pair;
  3. one 16-bit word for differential pair 826 in slice 2 804 wherein each bit corresponds to one of the layers for that differential pair;
  4. one 16-bit word for differential pair 828 in slice 2 804 wherein each bit corresponds to one of the layers for that differential pair,
  5. one 16-bit word for differential pair 826 in slice 3 806 wherein each bit corresponds to one of the layers for that differential pair;
  6. one 16-bit word for differential pair 828 in slice 3 806 wherein each bit corresponds to one of the layers for that differential pair;
  7. one 16-bit word for differential pair 826 in slice 4 808 wherein each bit corresponds to one of the layers for that differential pair; and
  8. one 16-bit word for differential pair 828 in slice 4 808 wherein each bit corresponds to one of the layers for that differential pair),
receives eight flip control signals (one for each pair clock signals received at each of the slices) from PI controller 803, and outputs differential phase interpolated clock phase interpolated clock signal.

More particularly, for example, slice 1 802 can receive CKR_0, CKR_180, CKR_45, and CKR_225, slice 2 804 can receive CKR_45, CKR_225, CKR_90, and CKR_270, slice 3 806 can receive CKR_90, CKR_270, CKR_135, and CKR_315, and slice 4 808 can receive CKR_135, CKR_315, CKR_0, and CKR_180.

While PI 800 is implemented with four slices, the PI can be implemented with any suitable arrangement of components (whether with slices or not) to achieve the same functionality as what is provided by the arrangement of FIG. 8.

In some embodiments, the seven bits of the phase interpolator are one bit for the clock polarity (e.g., the most significant bit), two bits for the selection of one slice from four slices (e.g., the next two most significant bits), and four bits used to encode the thermometer encoded digital control words SelX and SelBX (e.g., the remaining four least significant bits).

During operation, in some embodiments, the eight-phase clock signals from the QDLL are received at the flip buffers of each slice. Depending on the flip control signal, the eight-phase clock signals will pass straight through the flip buffers (as represented by the straight lines in the flip buffer schematic symbols) or be swapped by them (as represented by the X lines in the flip buffer schematic symbols).

The CMOS-to-CML buffers (which can be implemented using 2-bit programmable inverters, in some embodiments) will then shape the clipped eight-phase clock signals to sinusoidal 250-mVpp clocks. The shaped CML signals are then received at the gates of the corresponding transistors in the differential pairs. The switches at the sources of the transistors in differential pairs 826 and 828 are controlled by the thermometer encoded digital control words received on busses SelX and SelBX, where X corresponds to the slice number for the differential pairs. These switches make active or inactive the corresponding differential pairs across the 16 layers. For example, Sel1<0> makes active differential pair 826 of layer 1 of slice 1; Sel2<1> makes active differential pair 826 of layer 2 of slice 2; SelB1<0> makes active differential pair 828 of layer 1 of slice 1; Sel2B<1> makes active differential pair 828 of layer 2 of slice 2. The currents of each active differential pair across all layers and slices sum as controlled by the shaped CIVIL signals at their gates to provide interpolated CIVIL clock signals CKPI_p and CKPI_n. In some embodiments, differential pairs will only be active in one slice at a time. The interpolated CML clock signals are then converted to CMOS signals by CML-to-CMOS buffers to provide interpolated CMOS clock signals.

Unfortunately, gate-to-drain parasitic capacitance coupling at the transistors of the differential pairs of each layer of each slice introduce non-linearities into the interpolated CML clock signals (and thus the interpolated CMOS clock signals). To counter these non-linearities, the quadrature clock signals at one or more of the flip buffers corresponding to inactive differential pairs can be swapped.

In some embodiments, the PI can use an octagonal constellation (for example, as illustrated in FIG. 7) to interpolate eight-phase clocks with unitary steps.

In some embodiments, clock-flipping buffers 810 and 812 can flip the received clocks so that the same slice can cover the lower half-plane of the constellation diagram in FIG. 7. More particularly, when a flip signal is received by one or both of buffers 810 and 812, the corresponding buffer(s) can flip the signals at its input. For example:

if buffer 810 of slice 1 802 receives a flip signal, CKR_180 can be provided to buffer 814 (instead of buffer 816) of slice 1 802 and CKR_0 can be provided to buffer 816 (instead of buffer 814) of slice 1 802;

if buffer 812 of slice 1 802 receives a flip signal, CKR_225 can be provided to buffer 820 (instead of buffer 818) of slice 1 802 and CKR_45 can be provided to buffer 818 (instead of buffer 820) of slice 1 802;

if buffer 810 of slice 2 804 receives a flip signal, CKR_225 can be provided to buffer 814 (instead of buffer 816) of slice 2 804 and CKR_45 can be provided to buffer 816 (instead of buffer 814) of slice 2 804;

if buffer 812 of slice 2 804 receives a flip signal, CKR_270 can be provided to buffer 820 (instead of buffer 818) of slice 2 804 and CKR_90 can be provided to buffer 818 (instead of buffer 820) of slice 2 804;

if buffer 810 of slice 3 806 receives a flip signal, CKR_270 can be provided to buffer 814 (instead of buffer 816) of slice 3 806 and CKR_90 can be provided to buffer 816 (instead of buffer 814) of slice 3 806;

if buffer 812 of slice 3 806 receives a flip signal, CKR_315 can be provided to buffer 820 (instead of buffer 818) of slice 3 806 and CKR_135 can be provided to buffer 818 (instead of buffer 820) of slice 3 806;

if buffer 810 of slice 4 808 receives a flip signal, CKR_315 can be provided to buffer 814 (instead of buffer 816) of slice 4 808 and CKR_135 can be provided to buffer 816 (instead of buffer 814) of slice 4 808; and if buffer 812 of slice 4 808 receives a flip signal, CKR_180 can be provided to buffer 820 (instead of buffer 818) of slice 4 808 and CKR_0 can be provided to buffer 818 (instead of buffer 820) of slice 4 808.

In some embodiments, this flipping arrangement can enable the PI core to interpolate over 360 degrees with only four slices.

In some embodiments, the clock-flipping scheme in the table of FIG. 9 can be used. For example, as shown in this table:

when the interpolation range is from 0 to 45 degrees, the differential pairs in slice 1 802 are active and the 135/315 degree clocks are flipped;

when the interpolation range is from 45 to 90 degrees, the differential pairs in slice 2 804 are active and no clocks are flipped;

when the interpolation range is from 90 to 135 degrees, the differential pairs in slice 3 806 are active and the 0/180 degree clocks are flipped;

when the interpolation range is from 135 to 180 degrees, the differential pairs in slice 4 808 are active, the 0/180 degree clocks are flipped, and the 45/225 degree clocks are flipped;

when the interpolation range is from 180 to 225 degrees, the differential pairs in slice 1 802 are active, the 0/180 degree clocks are flipped, the 45/225 degree clocks are flipped, and the 90/270 degree clocks are flipped;

when the interpolation range is from 225 to 270 degrees, the differential pairs in slice 2 804 are active, the 0/180 degree clocks are flipped, the 45/225 degree clocks are flipped, the 90/270 degree clocks are flipped, and the 135/315 degree clocks are flipped;

when the interpolation range is from 270 to 315 degrees, the differential pairs in slice 3 806 are active, the 45/225 degree clocks are flipped, the 90/270 degree clocks are flipped, and the 135/315 degree clocks are flipped; and when the interpolation range is from 315 to 360 degrees, the differential pairs in slice 4 808 are active, the 90/270 degree clocks are flipped, and the 135/315 degree clocks are flipped, wherein differential pairs being active means that the switches of the sources of the transistors of the differential pairs are not completely off.

Figure 10A:
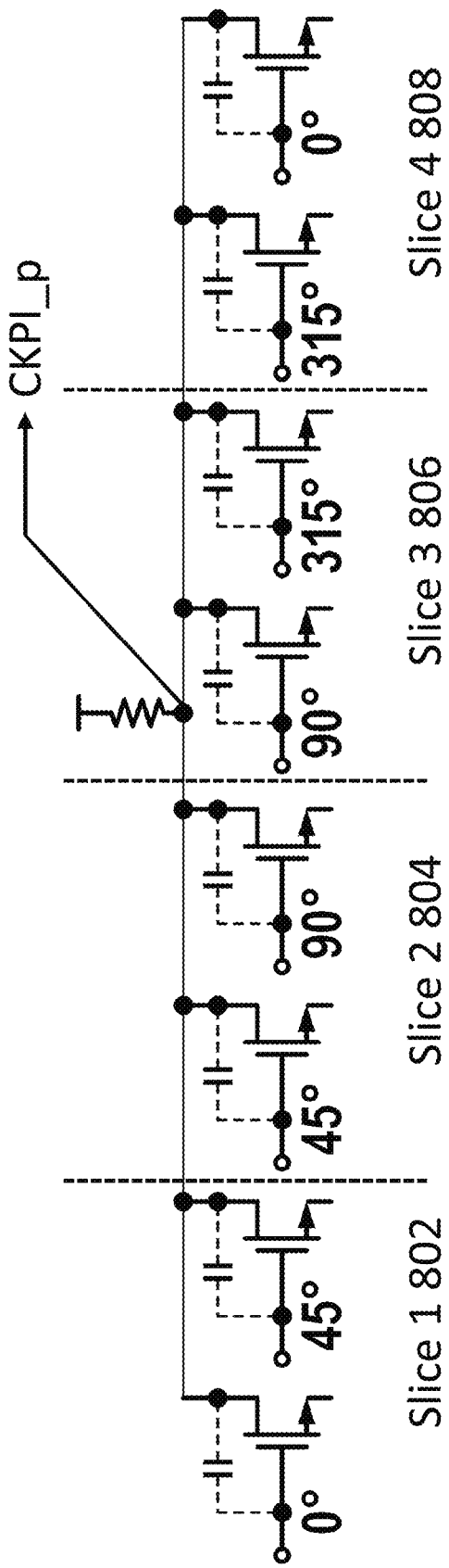
FIGS. 10A and 10B are examples of schematics showing clock flipping in accordance with some embodiments.
Figure 11A:
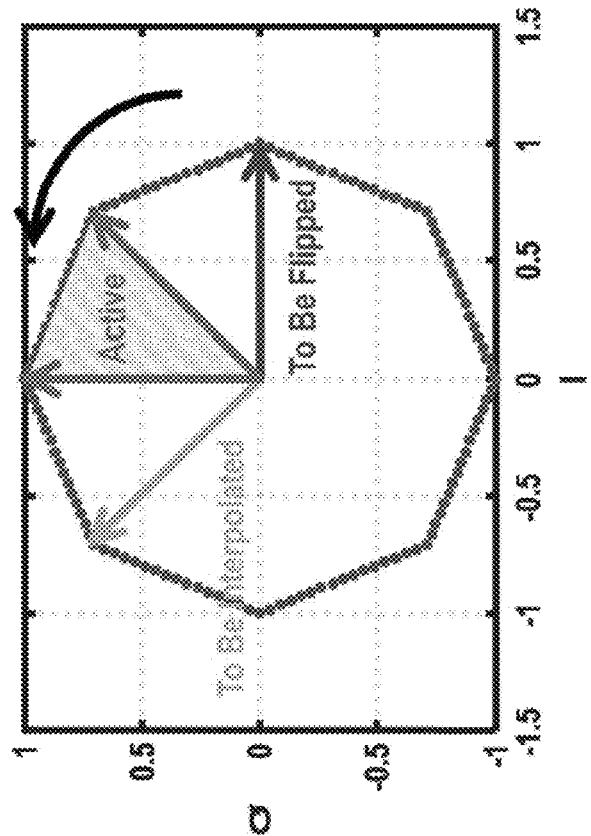
FIGS. 11A and 11B are examples of constellations showing active phase interpolation regions in accordance with some embodiments.

Turning to FIGS. 10A and 11A, the clock signals present at the gates of the left transistor of differential pair 826 across slices 802, 804, 806, and 808 when interpolating 0-45 degrees are shown. More particularly, from left to right in FIG. 10A, clock signals of 0 degrees, 45 degrees, 45 degrees, 90 degrees, 90 degrees, 315 degrees, 315 degrees, and 0 degrees are present at the gates of the transistors. These clock signals couple through the parasitic gate-to-drain capacitances of the transistors to CKPI_p.

Figure 10B:
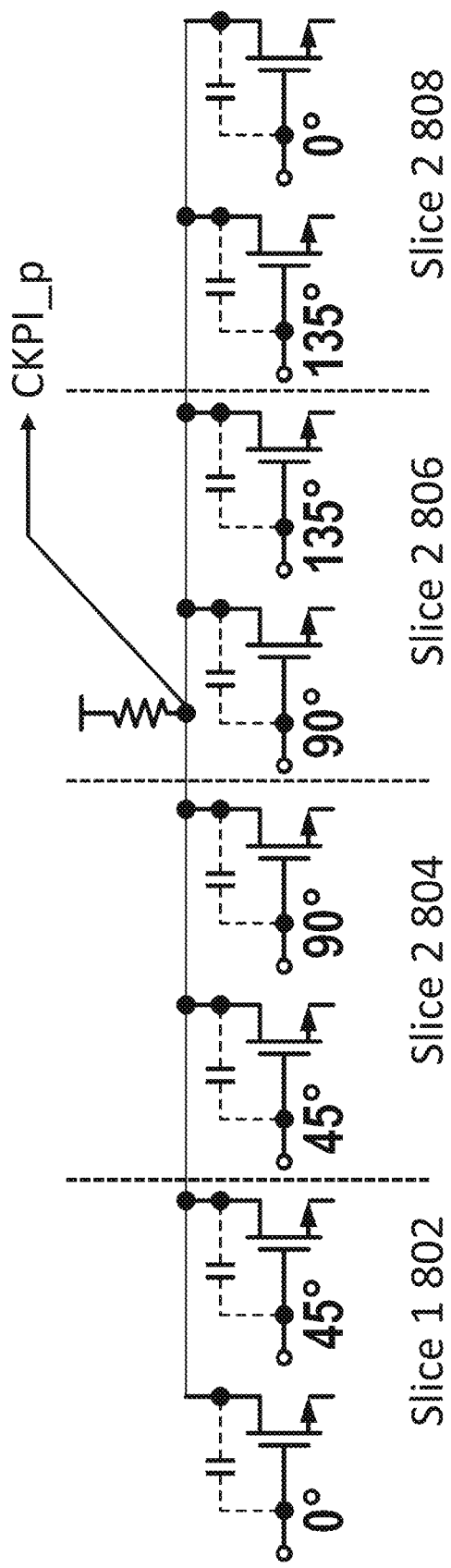
Figure 11B:
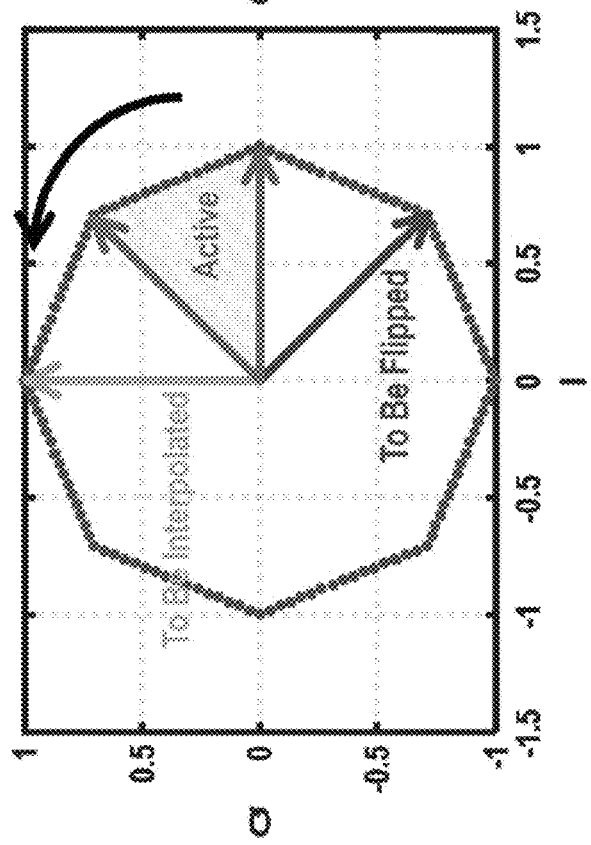

Turning to FIGS. 10B and 11B, the clock signals present at the gates of the left transistor of differential pair 826 across slices 802, 804, 806, and 808 when interpolating 45-90 degrees are shown. More particularly, from left to right in FIG. 10B, clock signals of 0 degrees, 45 degrees, 45 degrees, 90 degrees, 90 degrees, 135 degrees, 135 degrees, and 0 degrees are present at the gates of the transistors. These clock signals couple through the parasitic gate-to-drain capacitances of the transistors to CKPI_p. As shown, in bold above, the 315 degree couplings in FIG. 10A are 135 degree couplings when interpolating 45-90 degrees as shown in FIG. 10B.

In some embodiments, the flipping buffers can be omitted and double the number of slices provided such that each slice corresponds to one row in the table of FIG. 9 and the CKR clocks are provided to the CMOS-to-CIVIL buffers based on the clocks that would be present after flipping described above.

In some embodiments, the circuits described herein can be implemented in any suitable process. For example, in some embodiments, the circuits described herein can be implemented in a 65-nm bulk CMOS process.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A circuit for a multi-phase clock generator, comprising:
a delay line comprising a first plurality of differential unit delay cells,
wherein each of the first plurality of differential unit delay cells has a pair of clock inputs and a pair clock outputs,
wherein the first plurality of differential unit delay cells are connected in series such that the pair of clock outputs of a first of the first plurality of differential unit delay cells is connected to the pair of clock inputs of a second of the first plurality of differential unit delay cells, and
wherein each unit cell of the first plurality of differential unit delay cells outputs a pair of clock signals having different phases than each pair of clock signals output by other of the first plurality of differential unit delay cells; and
a ring oscillator comprising a second plurality of differential unit delay cells,
wherein each of the second plurality of differential unit delay cells has a pair of clock inputs, a pair of current injection inputs, and a pair clock outputs,
wherein the pair of current injection inputs of each of the second plurality of differential unit delay cells is coupled to the pair of clock outputs of a corresponding one of the first plurality of differential unit delay cells,
wherein the second plurality of differential unit delay cells are connected in series such that the pair of clock outputs of a first of the second plurality of differential unit delay cells is connected to the pair of inputs of a second of the second plurality of differential unit delay cells,
wherein the pair of outputs of a last of the second plurality of differential unit delay cells are flipped and connected to the pair of inputs of a first of the second plurality of differential unit delay cells, and
wherein each unit cell of the second plurality of differential unit cells outputs a pair of clock signals having different phases than each pair of clock signals output by other of the second plurality of differential unit delay cells,
wherein the delay line further comprises a dummy unit cell connected to a last of the first plurality of differential unit delay cells.

2. A circuit for a multi-phase clock generator, comprising:
a delay line comprising a first plurality of differential unit delay cells,
wherein each of the first plurality of differential unit delay cells has a pair of clock inputs and a pair clock outputs,
wherein the first plurality of differential unit delay cells are connected in series such that the pair of clock outputs of a first of the first plurality of differential unit delay cells is connected to the pair of clock inputs of a second of the first plurality of differential unit delay cells, and
wherein each unit cell of the first plurality of differential unit delay cells outputs a pair of clock signals having different phases than each pair of clock signals output by other of the first plurality of differential unit delay cells; and
a ring oscillator comprising a second plurality of differential unit delay cells,
wherein each of the second plurality of differential unit delay cells has a pair of clock inputs, a pair of current injection inputs, and a pair clock outputs,
wherein the pair of current injection inputs of each of the second plurality of differential unit delay cells is coupled to the pair of clock outputs of a corresponding one of the first plurality of differential unit delay cells,
wherein the second plurality of differential unit delay cells are connected in series such that the pair of clock outputs of a first of the second plurality of differential unit delay cells is connected to the pair of inputs of a second of the second plurality of differential unit delay cells,
wherein the pair of outputs of a last of the second plurality of differential unit delay cells are flipped and connected to the pair of inputs of a first of the second plurality of differential unit delay cells, and
wherein each unit cell of the second plurality of differential unit cells outputs a pair of clock signals having different phases than each pair of clock signals output by other of the second plurality of differential unit delay cells,
wherein the pair of current injection inputs of each of the second plurality of differential unit delay cells is coupled to the pair of output of a corresponding one of the first plurality of differential unit delay cells by a buffer.

3. A circuit for a multi-phase clock generator, comprising:
a delay line comprising a first plurality of differential unit delay cells,
wherein each of the first plurality of differential unit delay cells has a pair of clock inputs and a pair clock outputs,
wherein the first plurality of differential unit delay cells are connected in series such that the pair of clock outputs of a first of the first plurality of differential unit delay cells is connected to the pair of clock inputs of a second of the first plurality of differential unit delay cells, and
wherein each unit cell of the first plurality of differential unit delay cells outputs a pair of clock signals having different phases than each pair of clock signals output by other of the first plurality of differential unit delay cells; and
a ring oscillator comprising a second plurality of differential unit delay cells,
wherein each of the second plurality of differential unit delay cells has a pair of clock inputs, a pair of current injection inputs, and a pair clock outputs,
wherein the pair of current injection inputs of each of the second plurality of differential unit delay cells is coupled to the pair of clock outputs of a corresponding one of the first plurality of differential unit delay cells,
wherein the second plurality of differential unit delay cells are connected in series such that the pair of clock outputs of a first of the second plurality of differential unit delay cells is connected to the pair of inputs of a second of the second plurality of differential unit delay cells, wherein the pair of outputs of a last of the second plurality of differential unit delay cells are flipped and connected to the pair of inputs of a first of the second plurality of differential unit delay cells, and wherein each unit cell of the second plurality of differential unit cells outputs a pair of clock signals having different phases than each pair of clock signals output by other of the second plurality of differential unit delay cells, wherein each unit cell in the first plurality of differential unit delay cells comprises:

a first inverter having an input connected to a first of the pair of clock inputs of the unit cell and having an output connected to a first of the pair of clock outputs of the unit cell;

a second inverter having an input connected to a second of the pair of clock inputs of the unit cell and having an output connected to a second of the pair of clock outputs of the unit cell;

a third inverter having an input connected to the output of the first inverter and having an output connected to the output of the second inverter; and a fourth inverter having an input connected to the output of the second inverter and having an output connected to the output of the first inverter.

4. A circuit for a multi-phase clock generator, comprising:
a delay line comprising a first plurality of differential unit delay cells, wherein each of the first plurality of differential unit delay cells has a pair of clock inputs and a pair clock outputs, wherein the first plurality of differential unit delay cells are connected in series such that the pair of clock outputs of a first of the first plurality of differential unit delay cells is connected to the pair of clock inputs of a second of the first plurality of differential unit delay cells, and wherein each unit cell of the first plurality of differential unit delay cells outputs a pair of clock signals having different phases than each pair of clock signals output by other of the first plurality of differential unit delay cells; and a ring oscillator comprising a second plurality of differential unit delay cells, wherein each of the second plurality of differential unit delay cells has a pair of clock inputs, a pair of current injection inputs, and a pair clock outputs, wherein the pair of current injection inputs of each of the second plurality of differential unit delay cells is coupled to the pair of clock outputs of a corresponding one of the first plurality of differential unit delay cells, wherein the second plurality of differential unit delay cells are connected in series such that the pair of clock outputs of a first of the second plurality of differential unit delay cells is connected to the pair of inputs of a second of the second plurality of differential unit delay cells, wherein the pair of outputs of a last of the second plurality of differential unit delay cells are flipped and connected to the pair of inputs of a first of the second plurality of differential unit delay cells, and wherein each unit cell of the second plurality of differential unit cells outputs a pair of clock signals having different phases than each pair of clock signals output by other of the second plurality of differential unit delay cells, wherein each of the first plurality of differential unit cells also has a pair of current injection inputs.

5. The circuit of claim 4, wherein the pair of current injection inputs for each of the first plurality of differential unit delay cells is connected to ground.

6. The circuit of claim 3, wherein each unit cell in the first plurality of differential unit delay cells further comprises:

a first buffer having an input connected to a first of the pair of current injection inputs of the unit cell and having an output connected to the first of the pair of clock outputs of the unit cell; and a second buffer having an input connected to a second of the pair of current injection inputs of the unit cell and having an output connected to the second of the pair of clock outputs of the unit cell.

7. The circuit of claim 6, wherein the first buffer is formed from a plurality of selectable, parallel transistors.

8. A circuit for a multi-phase clock generator, comprising:
a delay line comprising a first plurality of differential unit delay cells, wherein each of the first plurality of differential unit delay cells has a pair of clock inputs and a pair clock outputs, wherein the first plurality of differential unit delay cells are connected in series such that the pair of clock outputs of a first of the first plurality of differential unit delay cells is connected to the pair of clock inputs of a second of the first plurality of differential unit delay cells, and wherein each unit cell of the first plurality of differential unit delay cells outputs a pair of clock signals having different phases than each pair of clock signals output by other of the first plurality of differential unit delay cells; and a ring oscillator comprising a second plurality of differential unit delay cells, wherein each of the second plurality of differential unit delay cells has a pair of clock inputs, a pair of current injection inputs, and a pair clock outputs, wherein the pair of current injection inputs of each of the second plurality of differential unit delay cells is coupled to the pair of clock outputs of a corresponding one of the first plurality of differential unit delay cells, wherein the second plurality of differential unit delay cells are connected in series such that the pair of clock outputs of a first of the second plurality of differential unit delay cells is connected to the pair of inputs of a second of the second plurality of differential unit delay cells, wherein the pair of outputs of a last of the second plurality of differential unit delay cells are flipped and connected to the pair of inputs of a first of the second plurality of differential unit delay cells, and wherein each unit cell of the second plurality of differential unit cells outputs a pair of clock signals having different phases than each pair of clock signals output by other of the second plurality of differential unit delay cells, wherein at least one unit cell of the first plurality of differential unit delay cells and at least one unit cell of the second plurality of differential unit delay cells include an identical set of components interconnected in an identical manner.

9. The circuit of claim 8, wherein each unit cell of the second plurality of differential unit delay cells includes an identical set of components interconnected in an identical manner.

10. A circuit for a multi-phase clock generator, comprising:
- a delay line comprising a first plurality of differential unit delay cells,
- wherein each of the first plurality of differential unit delay cells has a pair of clock inputs and a pair clock outputs,
- wherein the first plurality of differential unit delay cells are connected in series such that the pair of clock outputs of a first of the first plurality of differential unit delay cells is connected to the pair of clock inputs of a second of the first plurality of differential unit delay cells, and
- wherein each unit cell of the first plurality of differential unit delay cells outputs a pair of clock signals having different phases than each pair of clock signals output by other of the first plurality of differential unit delay cells;
- a ring oscillator comprising a second plurality of differential unit delay cells,
- wherein each of the second plurality of differential unit delay cells has a pair of clock inputs, a pair of current injection inputs, and a pair clock outputs,
- wherein the pair of current injection inputs of each of the second plurality of differential unit delay cells is coupled to the pair of clock outputs of a corresponding one of the first plurality of differential unit delay cells,
- wherein the second plurality of differential unit delay cells are connected in series such that the pair of clock outputs of a first of the second plurality of differential unit delay cells is connected to the pair of inputs of a second of the second plurality of differential unit delay cells,
- wherein the pair of outputs of a last of the second plurality of differential unit delay cells are flipped and connected to the pair of inputs of a first of the second plurality of differential unit delay cells, and
- wherein each unit cell of the second plurality of differential unit cells outputs a pair of clock signals having different phases than each pair of clock signals output by other of the second plurality of differential unit delay cells; and
- a first mixer that mixes the pairs of outputs of two of the second plurality of differential unit delay cells to produce a first mixer output signal and a second mixer that mixes the pairs of outputs of another two of the second plurality of differential unit delay cells to produce a second mixer output signal.

11. The circuit of claim 10, further comprising an operation transconductance amplifier that receives the first mixer output signal and the second mixer output signal and produce tuning feedback signal that is provided to the delay line and to the ring oscillator.

12. The circuit of claim 8, wherein each unit cell of the first plurality of differential unit delay cells has includes an identical set of components interconnected in an identical manner.

\* \* \* \* \*